(12) United States Patent
Zocher et al.

(10) Patent No.: US 6,400,218 B1
(45) Date of Patent: Jun. 4, 2002

(54) VARIABLE GAIN CONTROL CIRCUIT FOR A RECEIVER AND METHOD THEREFOR

(75) Inventors: Andrew G. Zocher, Spring Grove, IL (US); Timothy K. Coffman, Chandler, AZ (US); Joseph P. Heck, Ft. Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,824

(22) Filed: Feb. 29, 2000

(51) Int. Cl.$^7$ .................................................. G06G 7/26
(52) U.S. Cl. ....................... 327/560; 330/282
(58) Field of Search ................. 327/108–112, 560–563; 330/252–254, 282

(56) References Cited

U.S. PATENT DOCUMENTS

| | | |
|---|---|---|
| 3,582,689 A | 6/1971 | Smith et al. |
| 4,338,527 A | 7/1982 | Nagano |
| 4,489,282 A * | 12/1984 | Jett, Jr. ........................ 330/261 |
| 4,983,930 A | 1/1991 | Wadsworth |
| 5,055,719 A | 10/1991 | Hughes |
| 5,124,666 A | 6/1992 | Liu et al. |
| 5,138,278 A | 8/1992 | Stessen |
| 5,352,989 A | 10/1994 | Toumazou et al. |
| 5,392,003 A | 2/1995 | Nag et al. |
| 5,574,678 A * | 11/1996 | Gorecki ....................... 364/807 |
| 5,912,583 A * | 6/1999 | Pierson et al. ............... 327/553 |
| 5,999,052 A * | 12/1999 | Tang ............................ 330/254 |
| 6,112,125 A * | 8/2000 | Sandusky ..................... 700/28 |

OTHER PUBLICATIONS

K. C. Smith & A. Sedra, The Current Conveyor—A New Circuit Building Block, Proceedings of the IEEE, Aug. 1968, at 1368–69.

A. Sedra & K. C. Smith, A Second–Generation Current Conveyor and Its Applications, IEEE Transactions on Circuit Theory, Feb. 1970, at 132–34.

W. Surakampontom & P. Thitimajshima, Integrable Electronically Tunable Current Conveyors, IEE Proceedings, vol. 135, Pt. G, No. 2, Apr. 1988, at 71–77.

W. Surakampontom & K. Kumwachara, CMOS–Based Electronically Tunable Current Conveyor, Electronics Letters, vol. 28, No. 14, Jul. 1992, at 1316–17.

Alfonso Carlosina & George S. Moschytz, Design of Variable–Gain Current Conveyors, IEEE Transactions on Circuits and Systems–Fundamental Theory, vol. 41, No. 1, Jan. 1994, at 79–81.

* cited by examiner

Primary Examiner—Kenneth B. Wells
(74) Attorney, Agent, or Firm—Sylvia Y. Chen; Roland K. Bowler, II

(57) ABSTRACT

A variable gain control circuit (125, 127) includes a programmable operational transconductance amplifier (OTA) circuit (214) and a programmable conveying circuit (544). The conveying circuit (544) has a programmable differential circuit (550) interconnected to a pair of programming inputs (564, 566). The pair of programming inputs (564, 566) is interconnected to a pair of programming inputs (238, 240) that set the gain of the OTA circuit (214). When the OTA circuit (214) is configured as an operational transconductance filter (112, 113), the programmable differential circuit (550) can adjust the gain of the conveying circuit (544) to compensate for changes in the input impedance of the filter (112, 113). The programming inputs (238, 240) that set the input impedance and bandwidth of the filter (113, 113) also control the amount of signal current transmitted by the conveying circuit (544).

24 Claims, 3 Drawing Sheets ized # US 6,400,218 B1

VARIABLE GAIN CONTROL CIRCUIT FOR A RECEIVER AND METHOD THEREFOR

FIELD OF THE INVENTION

This invention relates to programmable circuits, and more particularly, to programmable circuits that adjust gain with respect to a given circuit impedance or a given circuit bandwidth.

BACKGROUND OF THE INVENTION

Operational transconductance amplifier (OTA) circuits can be used to form active filters with voltage-variable control over a number of filter parameters. Such active filters are commonly called operational transconductance filters. An operational transconductance filter has the ability to change bandwidth and gain while preserving the shape of its attenuation versus frequency response. The transconductance of the operational transconductance filter can also affect the bandwidth of the passband.

A significant drawback of operational transconductance filters, however, is that a change in bandwidth often causes an undesired change in input impedance. Thus, for a given signal input current value, the input voltage to an operational transconductance filter changes when there is a change in bandwidth. This undesired change in voltage gain can be detrimental to systems that process a wide range of input signals.

For example, many receivers, such as direct-conversion or zero intermediate-frequency receivers, use a voltage-to-current circuit to convert the voltage output of a mixer to a current. This current drives the input of a baseband filter. Because the gain of voltage-to-current circuits often does not change with the input impedance of the baseband filter, the voltage gain of the cascade of the voltage-to-current circuit and the baseband filter is often proportional to the input impedance of the baseband filter. This relationship can be undesirable in applications that have a varying bandwidth. This condition may cause a loss of sensitivity for high frequency bandwidths (low $R_{gm}/\alpha$) or cause baseband filter input saturation for low frequency bandwidths (high $R_{gm}/\alpha$) where $\alpha/R_{gm}$ is the transconductance ($g_m$) of an operational transconductance amplifier. Thus, it is a challenge to maintain a stable voltage gain to ensure that an operational transconductance filter receives a sufficient portion of the signal strength of an input signal.

DETAILED DESCRIPTION OF THE PREFERRED EMBODIMENT

The disclosed programmable OTA circuit and programmable conveying circuit maintain receiver sensitivity and signal integrity over a wide range of bandwidths and varying input impedances. Variable gain control circuitry includes a programmable OTA circuit and a programmable conveying circuit. The conveying circuit has a programmable differential circuit with a pair of programming inputs. The pair of programming inputs is interconnected to a pair of programming inputs that set the gain of the OTA circuit. When the OTA circuit is configured as an operational transconductance filter, the programmable differential circuit can adjust the gain of the conveying circuit to compensate for changes in the input impedance of the filter. The programming inputs that set the input impedance and bandwidth of the filter also control the amount of signal current transmitted by the conveying circuit.

Figure 1:
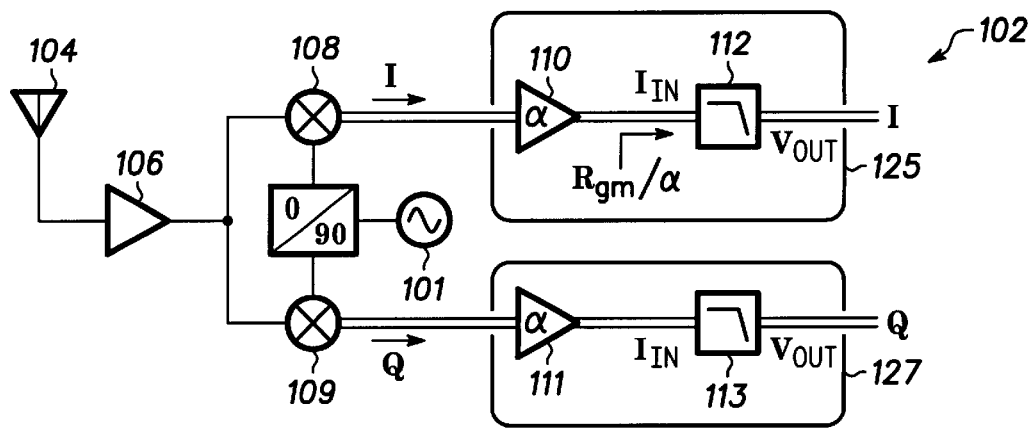
FIG. 1 shows a block diagram of a receiver incorporating a preferred embodiment.

FIG. 1 shows a block diagram of an exemplary I-Q receiver 102 incorporating a preferred embodiment. The receiver 102, which may be a direct-conversion receiver (i.e., a zero intermediate-frequency receiver), includes an antenna signal input 104, a radio frequency preamplifier 106, a pair of mixers 108, 109, a pair of programmable conveying circuits 110, 111 (i.e., current amplifiers with a gain of $\alpha$), and a pair of baseband filters 112,113. The baseband filters 112, 113 each have a differential input impedance of $R_{gm}/\alpha$ where $R_{gm}$ is the fixed resistance shown in FIG. 2 and $\alpha$ is a parameter proportional to the bandwidth of the baseband filter 112, 113.

A radio frequency signal enters the receiver 102 at the signal input 104. Radio frequency preamplifier 106 amplifies the signal and drives the mixers 108, 109. A local oscillator 101 is selected such that the in-phase "I" and quadrature "Q" signals that emerge from the mixers 108, 109, are baseband signals plus interference signals.

Variable gain control circuits 125, 127 include programmable conveying circuits 110, 111 that buffer signals "I" and "Q" with a gain of $\alpha$. When the baseband filters 112, 113 in the variable gain control circuits 125, 127 are implemented using operational transconductance amplifier and capacitor circuits (OTA-Cs) or programmable OTC circuits, such as the OTA circuit 214 shown in FIG. 2, the bandwidth of the receiver 102 can be varied by changing the transconductance ($g_m$) of the OTA circuit.

Figure 2:
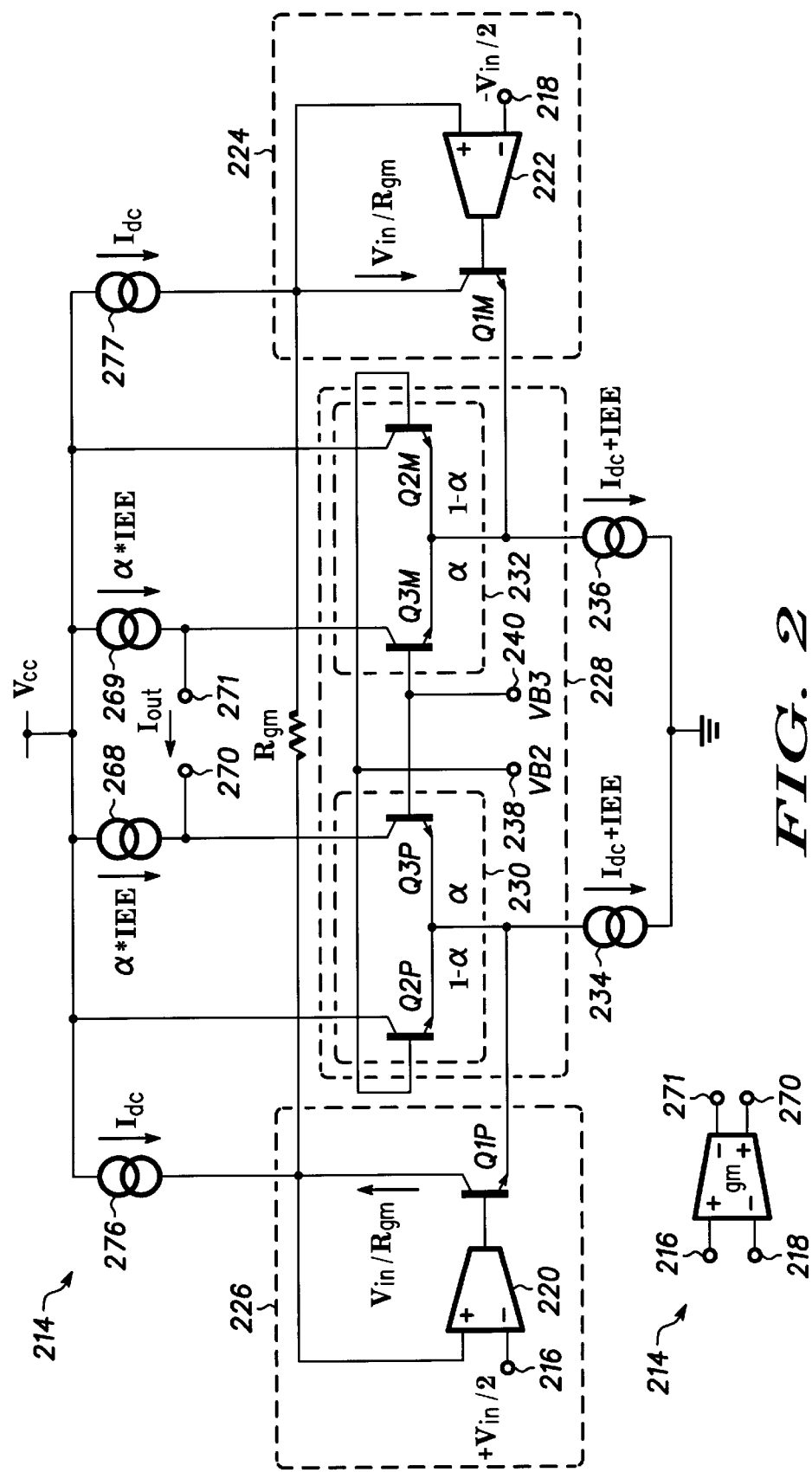
FIG. 2 shows a block diagram of a programmable operational transconductance amplifier (OTA) circuit that can be implemented in a baseband filter of FIG. 1.

FIG. 2 shows a block diagram of a programmable OTA circuit 214 that can be implemented in a baseband filter 112, 113 of FIG. 1. OTA inputs 216,218 are directly coupled to the inverting input terminals of operational amplifiers (opamps) 220 and 222. The opamps 220, 222 have output swings between a source and a ground potential. The output of one opamp 220 drives the base of a transistor Q1P, which has a collector coupled to a constant current source 276. The output of the other opamp 222 drives the base of another transistor Q1M, which has a collector coupled to a constant current source 277. The collector currents of transistors Q1P and Q1M are proportional to the input signals received at inputs 216 and 218, respectively.

Preferably, the inputs 216,218 are differentially driven by incoming signals. As illustrated, the incoming signals are +$V_{in}/2$ and $-V_{in}/2$. The collector potentials of Q1P and Q1M are driven to +$V_{in}/2$ and $-V_{in}/2$, respectively, which sets the collector alternating currents of Q1P and Q1M to $V_{in}/R_{gm}$ as shown in FIG. 2. The overall transconductance ($g_m$) of the OTA circuit 214 shown in FIG. 2 is equal to $\alpha/R_{gm}$.

The combination of transistors Q1P and Q1M and opamps 220 and 222, respectively, form differential pair voltage-to-current converters 226 and 224. Transistors Q1P and Q1M couple the voltage-to-current converters 226 and 224, respectively, to a programmable differential circuit 228.

Programmable differential circuit 228 includes a first differential transistor pair Q2P, Q3P and a second differential transistor pair Q3M, Q2M. Transistor pair Q2P, Q3P forms a first programmable differential amplifier circuit 230, which behaves as a signal current steering circuit. Transistor pair Q2P, Q3P is interconnected with the transistor Q1P and is emitter biased by a constant current source 234. Similarly, transistor pair Q3M, Q2M forms a second programmable differential amplifier circuit 232, which also behaves as a signal current steering circuit. The second transistor pair Q3M, Q2M is interconnected with the transistor Q1M and is emitter biased by constant current source 236. Each programmable differential amplifier circuit 230, 232 provides variable current gains.

The programmable differential circuit 228 is programmed through first programming input 238 and second programming input 240. When one of the programming inputs 238, 240 is driven by the corresponding signals VB2, VB3 to a higher potential than the other, direct-current (dc) current will flow from dc current sources 268, 269 or $V_{cc}$ through the path of least resistance. The path can include transistor pair Q3P, Q3M or transistor pair Q2P, Q2M, which adjust the output sourcing current that flows through the output terminals 270, 271. The signals VB2, VB3 are controlled by an external source, such as for example, a signal processor or any external controller.

While FIG. 2 illustrates one embodiment of an OTA circuit 214, any known programmable OTA may be used. In one embodiment, the OTA circuit disclosed in U.S. Pat. No. 5,392,003 entitled "Wide Tuning Range Operational Transconductance Amplifiers" is used, the specification of which is incorporated herein by reference. The referenced patent and this application are both assigned to Motorola, Inc.

Figure 3:
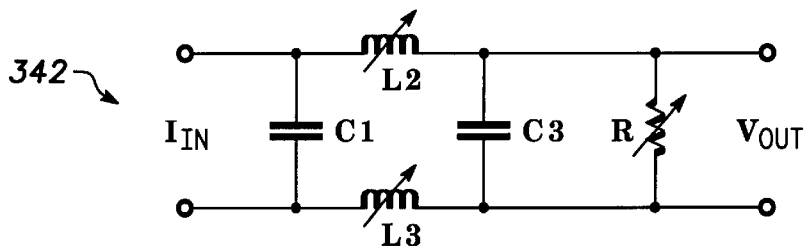
FIG. 3 shows a schematic diagram of a tunable filter that can be incorporated into a baseband filter shown in FIG. 1.
Figure 4:
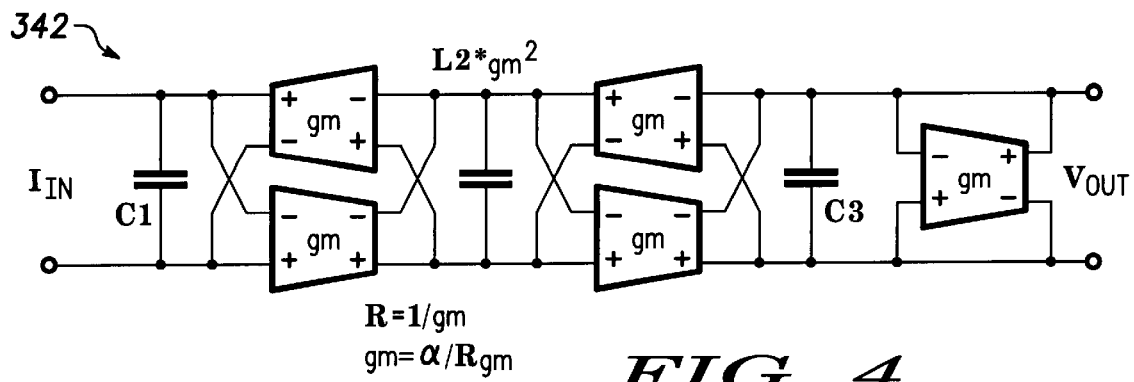
FIG. 4 shows a block diagram of a filter in FIG. 3 implemented using the programmable operational transconductance amplifier of FIG. 2.

FIG. 3 shows a schematic diagram of a tunable filter 342 that can be incorporated into a baseband filter 112, 113 shown in FIG. 1. The tunable filter 342 includes capacitors C1, C3, variable inductors L2, L3, and variable resistor R configured as a third-order low-pass network. As shown in FIG. 4, the tunable filter 342 shown in FIG. 3 can be implemented using multiple programmable OTA circuits 214 of FIG. 2. The transconductance of such a tunable filter 342 is defined as $g_m = \alpha/R_{gm}$, and the input impedance is defined as $R = 1/g_m = R_{gm}/\alpha$ where $g_m$ is the transconductance of the OTA circuits and $\alpha$ is the ratio of the output current and the input current. Thus, the low frequency input impedance of the tunable filter 342 is inversely proportional to $\alpha$.

Figure 5:
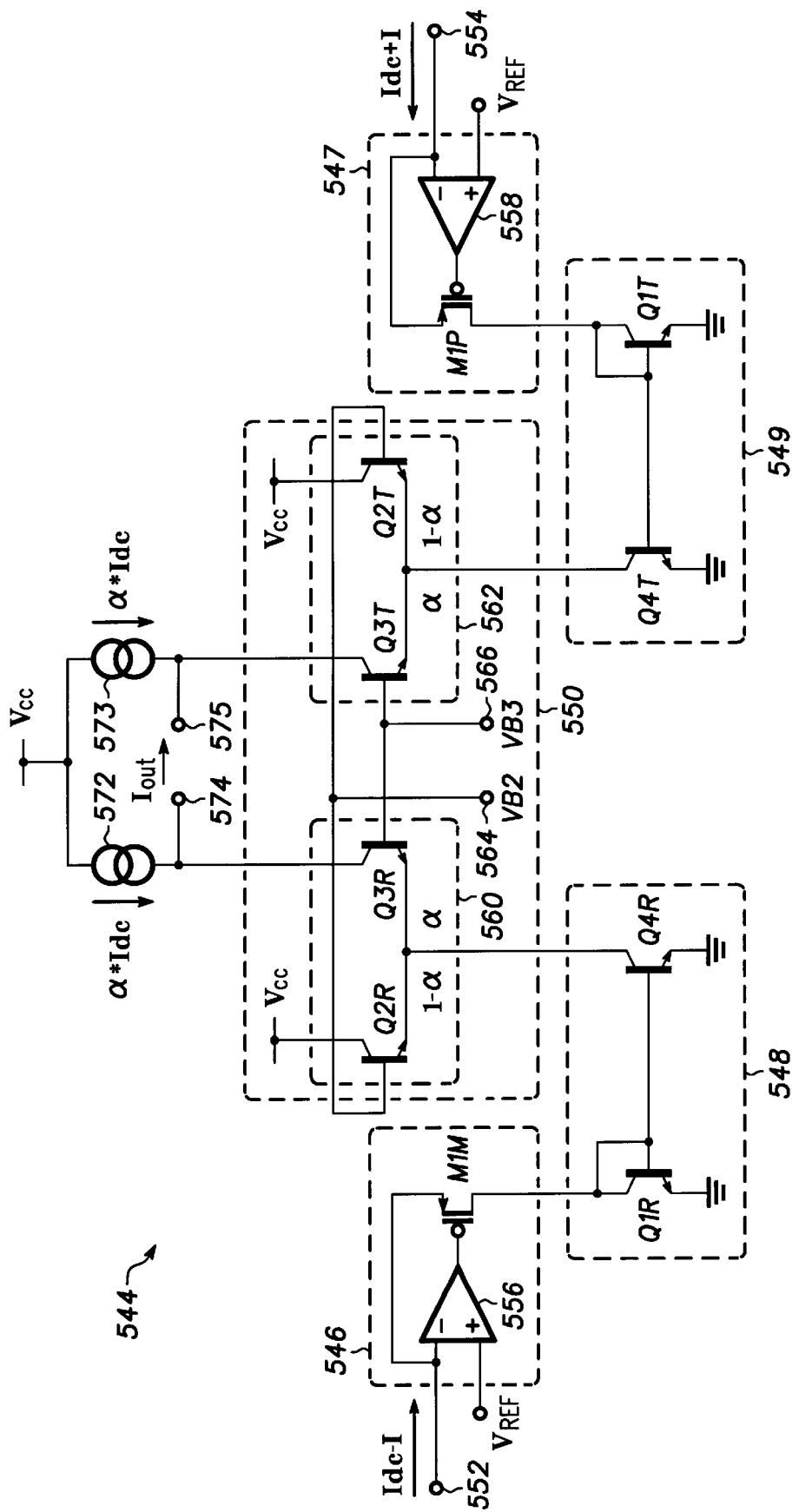
FIG. 5 shows a block diagram of a programmable conveying circuit that can be implemented as a programmable conveying circuit of FIG. 1.

FIG. 5 shows a block diagram of a programmable conveying circuit 544. The programmable conveying circuits 110, 111 shown in FIG. 1 can be implemented using the programmable conveying circuit 544 shown in FIG. 5. Programmable conveying circuit 544 includes a pair of second-generation current conveyors 546, 547, a pair of current mirrors 548, 549, and a programmable differential circuit 550.

A first second-generation current conveyor 546 has an input 552 directly coupled to the inverting input of a first opamp 556. The second second-generation current conveyor 547 has an input 554 directly coupled to the inverting input of a second opamp 558. An inverted alternating current in-phase signal ($-I$) is superimposed on a dc current and coupled to the inverting input of opamp 556 using a feedback circuit that is well known to those of ordinary skill in the art. Likewise, a non-inverted alternating current in-phase signal ($+I$) is superimposed on a dc current and coupled to the inverting input of opamp 558. The dc voltage of the inputs 552, 554 are held close to the reference voltage $V_{ref}$ by the large gain of the feedback loop which includes the opamps 556, 558. Preferably, the opamps 556, 558 can handle large input and output voltage swings.

Second-generation current conveyors 546 and 547, which can be low-voltage variable gain current conveyors, convey the input current from the input terminals to the drain of p-channel MOSFETS M1M and M1P, respectively, when driven by the outputs of opamps 556 and 558. The feedback loops of opamps 556 and 558 provide low impedance inputs, which minimize the voltage swing and the loading effect that the current conveyors 546 and 547 have on the input circuit (e.g., the mixers 108, 109 shown in FIG. 1). The drain current is fed to transistors Q1R, Q4R and transistors Q4T,Q1T which form current mirrors 548, 549, respectively. The current mirrors 548, 549 provide regulated emitter currents for the programmable differential circuit 550.

The programmable differential circuit 550 includes a first differential transistor pair Q2R, Q3R and a second differential transistors pair Q3T, Q2T. Transistor pair Q2R, Q3R forms a programmable differential amplifier circuit 560, which behaves as a signal current steering circuit. Transistor pair Q2R, Q3R interconnects with the transistor Q4R, which is programmed to source the same quantity of current sunk by the transistor Q1R. Transistor pair Q3T, Q2T forms another programmable differential amplifier circuit 562, which behaves as a signal current steering circuit. Transistor pair Q3T, Q2T interconnects with the transistor Q4T, which is programmed to source the same quantity of current sunk by the transistor Q1T. Each programmable differential amplifier circuit 560, 562 provides variable current gains.

The programmable differential circuit 550 is programmed through third programming input 564 and fourth programming input 566, which adjust the output sourcing current, from the pair of current sources 572, 573, that flows through output terminals 574, 575. The signals VB2, VB3 that actuate the programmable differential circuit 550 are generated by the same external source that controls first programming input 238 and second programming input 240 of OTA circuit 214 (shown in FIG. 2). Thus, the same two signals VB2, VB3 that set the input impedance and bandwidth of the OTA filter 342 (shown in FIG. 4) also control the amount of signal current transmitted through output terminals 574, 575 of the programmable conveying circuit 544. The current gain of the conveying circuit 544 is inversely proportional to the input impedance of the baseband filters 112, 113 (shown in FIG. 1). This relationship maintains a constant voltage at the input to the baseband filters 112, 113, regardless of the frequency bandwidth of the receiver 102. Thus, the programmable conveying circuit 544 maintains the gain distribution in the receiver 102 constant as the frequency bandwidth changes.

The variable gain control circuit and method may be used with cellular and personal communication technology such as voice/data signal processing receivers and pagers. The programmable OTA circuit 214 and programmable conveying circuit 544 provide automatic gain adjustments which make OTA circuit 214 and conveying circuit 544 well suited for low voltage applications (at least as low as 1.7 volts) that desire a current gain to track the input impedance of a successive circuit stage. The variable gain control circuit is modular in design and can be used to control current gain through a plurality of circuit stages, which in the end can maintain a desired output signal level.

The variable gain control circuit can be fabricated on a single chip, such as a single-chip direct-conversion transceiver and may use integrated amplifier circuits. The foregoing description has described only a few of the many forms that the invention can take, and should therefore be taken as illustrative rather than limiting. It is therefore the following claims, including all of the equivalents that are intended to define the scope of the invention.

We claim:

1. A variable gain control circuit comprising:
   a programmable operational transconductance amplifier circuit having a first programming input and a second programming input; and
   a programmable conveying circuit having a programmable differential circuit with a third programming input and a fourth programming input,
   the first programming input interconnected to the third programming input and the second programming input interconnected to the fourth programming input.

2. The variable gain control circuit of claim 1 wherein the programmable conveying circuit includes a differential amplifier circuit that behaves as a signal current steering circuit.

3. The variable gain control circuit of claim 2 wherein the programmable operational transconductance amplifier circuit includes a differential amplifier circuit that behaves as signal current steering circuit.

4. The variable gain control circuit of claim 1 wherein the programmable conveying circuit includes a pair of integrated amplifier circuits each having a differential gain, in which each of the pair of integrated amplifier circuits has differential inputs and differential outputs.

5. The variable gain control circuit of claim 1 wherein the programmable conveying circuit includes a first second-generation current conveyor circuit and a second second-generation current conveyor circuit.

6. The variable gain control circuit of claim 5 wherein the first second-generation current conveyor circuit is coupled to a first variable gain current mirror circuit.

7. The variable gain control circuit of claim 6 wherein the second second-generation current conveyor circuit is coupled to a second variable gain current mirror circuit.

8. The variable gain control circuit of claim 7 wherein the first variable gain current mirror circuit is coupled to a differential amplifier circuit.

9. The variable gain control circuit of claim 1 wherein the programmable conveying circuit includes a pair of current sources that provide output sourcing current.

10. The variable gain control circuit of claim 1 wherein the programmable differential circuit is coupled to the programmable operational transconductance amplifier circuit.

11. The variable gain control circuit of claim 1 wherein the programmable differential circuit includes a first differential amplifier circuit and a second differential amplifier circuit.

12. A variable gain control circuit comprising:
    a programmable amplifier circuit having a first programming input and a second programming input;
    a programmable conveying circuit having a programmable differential circuit coupled to the first programming input and the second programming input, and including a first differential amplifier circuit and a second differential amplifier circuit;
    a first current mirror circuit coupled to the first differential amplifier circuit;
    a second current mirror circuit coupled to the second differential amplifier circuit;
    a first current source coupled to the first differential amplifier circuit; and
    a second current source coupled to the second differential amplifier circuit.

13. The variable gain control circuit of claim 12 wherein the programmable conveying circuit includes a first second-generation current conveyor circuit coupled to the first current mirror circuit and a second second-generation current conveyor circuit coupled to the second current mirror circuit.

14. The variable gain control circuit of claim 12 wherein the programmable amplifier circuit comprises a programmable operational transconductance amplifier.

15. The variable gain control circuit of claim 12 wherein the programmable amplifier circuit comprises a programmable operational transconductance amplifier and capacitor filter.

16. The variable gain control circuit of claim 12 wherein the first current source is a direct-current (dc) current source and the second current source is a direct-current (dc) current source.

17. A method for maintaining signal gain in a receiver over a range of bandwidths comprising:
    interconnecting a plurality of programmable operational transconductance amplifier circuits to form an operational transconductance filter circuit with a first programming input and a second programming input;
    interconnecting a conveying circuit having a programmable differential circuit with a third programming input and a fourth programming input to a current input of the operational transconductance filter circuit; and
    adjusting a gain of the programmable differential circuit to compensate for changes in an input impedance of the operational transconductance filter circuit.

18. A method of claim 17 further comprising the step of interconnecting the first programming input to the third programming input and interconnecting the second programming input to the fourth programming input.

19. A method of claim 17 wherein the first programming input and the third programming input along with the second programming input and the fourth programming input control a bandwidth of the operational transconductance filter circuit and a signal level generated by the conveying circuit.

20. An electrical circuit comprising:
   a programmable conveying circuit having an output, the programmable conveying circuit having a programming input;
   an operational transconductance filter circuit having an input coupled to the output of the programmable conveying circuit, the operational transconductance filter circuit having a programming input,
   the programming input of the programmable conveying circuit interconnected to the programming input of the operational transconductance filter circuit for maintaining a constant gain independent of frequency bandwith.

21. The circuit of claim 20, the programmable conveying circuit includes first and second second-generation conveyor circuits each coupled to a corresponding current mirror circuit, the mirror circuits coupled to a programmable differential circuit.

22. An electrical circuit comprising:
   a programmable conveying circuit having a current gain;
   an operational transconductance filter circuit having an input impedance,
   an output of the programmable conveying circuit coupled to an input of the operational transconductance filter circuit,
   the current gain of the programmable conveying circuit inversely proportional to the input impedance of the operational transconductance filter circuit.

23. The circuit of claim 22, a programming input of the programmable conveying circuit coupled to a programming input of the operational transconductance filter circuit.

24. The circuit of claim 23, the programmable conveying circuit includes first and second second-generation conveyor circuits each coupled to a corresponding current mirror circuit, the mirror circuits coupled to a programmable differential circuit.

* * * * *